(12) United States Patent
Okumura

(10) Patent No.: US 6,355,578 B1
(45) Date of Patent: Mar. 12, 2002

(54) MANUFACTURING METHOD FOR A COMPOSITE DEVICE

(75) Inventor: Yohichi Okumura, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/179,913

(22) Filed: Oct. 27, 1998

Related U.S. Application Data (62) Division of application No. 08/949,428, filed on Oct. 14, 1997, now abandoned.

(51) Int. Cl.[7] .................................................. G11C 8/00

(52) U.S. Cl. ........................... 438/763; 438/48; 438/52; 438/758; 257/254; 257/417; 257/419; 257/420

(58) Field of Search ............................. 438/48, 52, 758; 438/763; 257/254, 419, 420, 417

(56) References Cited

U.S. PATENT DOCUMENTS 5,619,472 A * 4/1997 Okumura ............... 365/230.03

OTHER PUBLICATIONS

Matsumoto et al., "A Capacitive Accelerometer Using SDB-SO1 Structure", The 8th International Conference on Solid Sensors and Actuators and Eurosensors IX, Stockholm SV, 6/25-29/ 95, pp. 550-553.*

* cited by examiner

Primary Examiner—Charles Bowers
Assistant Examiner—Lisa Kilday
(74) Attorney, Agent, or Firm—Bret J. Petersen; Frederick J. Telecky, Jr.

(57) ABSTRACT

To offer a technique that can form electrodes in a composite device without using a lift-off method. In the manufacture of a composite device 2 in which a wafer 50 that has a sacrificial layer 51 is used, a mask film 66 that has been patterned is formed; patterning is given to a structural layer 54, the sacrificial layer 51 is etched from the area that is exposed, a movable part 11 is formed in an area where said sacrificial layer 51 is removed, and a fixed part 10 is formed in an area where the sacrificial layer 51 remains; also, a thin metallic film 60 is formed and patterning is given before forming the mask film 66, with electrodes 37 for an external electrical connection being formed. A protective film thin titanium tungsten film 64 is formed on the surface of said thin metallic film 60, with the thin metallic film 60 being protected during etching of the sacrificial layer 51. It can be done without using a lift-off method, and the thin film wiring 38 and the electrodes 37 can also be formed from the same thin metallic film 60.

13 Claims, 7 Drawing Sheets

MANUFACTURING METHOD FOR A COMPOSITE DEVICE

This is a division of application Ser. No. 08/949,248, filed Oct. 14, 1997, now abandoned.

FIELD OF THE INVENTION

The present invention concerns a composite device, as well as its manufacturing method. It particularly concerns a method for a composite device equipped with a micromachine and a circuit element, with the thin metallic film at the circuit element being protected by a protective film during etching of the sacrifice layer during the formation of said micromachine.

BACKGROUND OF THE INVENTION

Silicon micromachining techniques have been widely used in recent years; they are applied to acceleration sensors and angular velocity sensors, for example, in which microscopic sensor elements are formed on top of a silicon semiconductor substrate.

Figure 3:
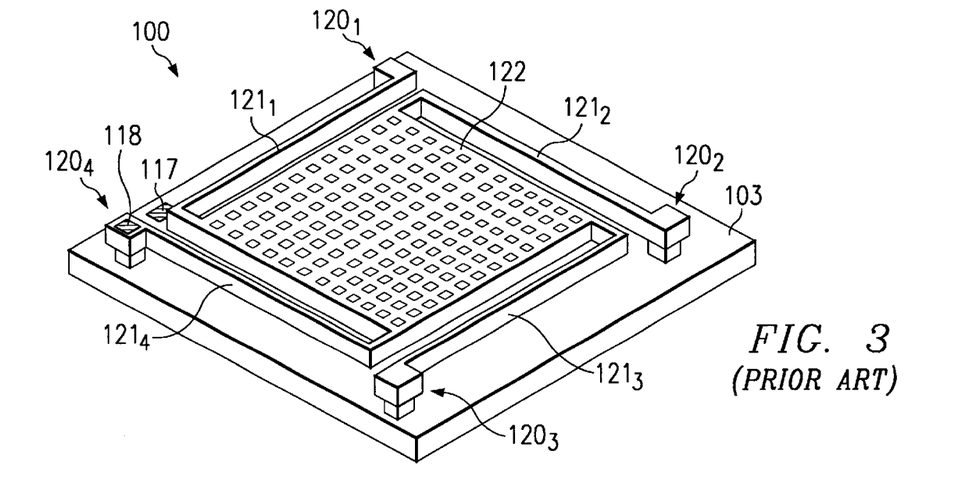
FIG. 3 is an oblique view of a sensor in the existing technology.

An acceleration sensor is illustrated by the number 100 in FIG. 3 as an example of such a silicon micromachine.

This acceleration sensor 100 has a box area 122, arms $121_1$ to $121_4$, and fixed parts $120_1$ to $120_4$ that are formed on top of a silicon substrate 103. The box area 122 is formed into a rectangular shape and the arms $121_1$ to $121_4$ are connected to its four corners at one end, with each of the arms $121_1$ to $121_4$ being connected to each of the fixed parts $120_1$ to $120_4$ at the other end.

The fixed parts $120_1$ to $120_4$ are secured over the silicon substrate 103; on the other hand, the box area 122 and the arms $121_1$ to $121_4$ are constructed so that they can freely move without making contact with the substrate 103. It is constructed so that the arms $121_1$ to $121_4$ are bent vertically using the fixed parts $120_1$ to $120_4$ as support points when the acceleration sensor 100 is subjected to an acceleration force in the vertical direction. Resulting movement between the parallel and flat capacitor plates, consisting of the box area 122 and the substrate 103 causes the capacitance to change.

The simplified manufacturing processes of such an acceleration sensor 100 are illustrated in FIGS. 4(a)–(l), which will be explained below.

With reference to FIGS. 4(a)–(e), two monocrystalline silicon substrates, onto which a silicon oxide film is formed on the surface, are first prepared; they are bonded together by a direct bonding method while their silicon oxide films closely adhere to each other, with one silicon wafer being formed. Successively, the surface at one side, which is opposite from the side onto which a monocrystalline silicon thermal oxide film is formed, is polished into a structural layer 104, and the monocrystalline silicon layer on the other side becomes a substrate 103. The silicon oxide film, which was used for direct bonding, remains between said substrate 103 and the structural layer 104 as a sacrificial layer 101 (FIG. 4(a)).

Figure 4A:
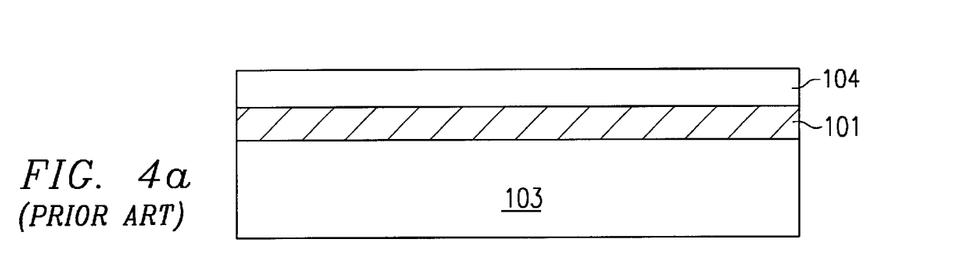
FIGS. 4(a)–(j) show diagrams that explain the manufacturing process for a prior art process.
Figure 4B:
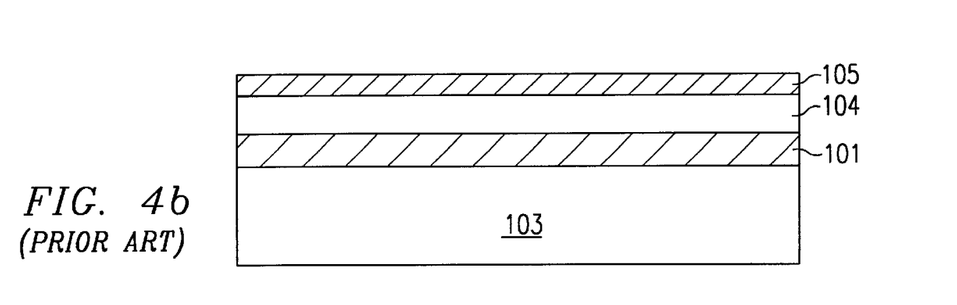
Figure 4C:
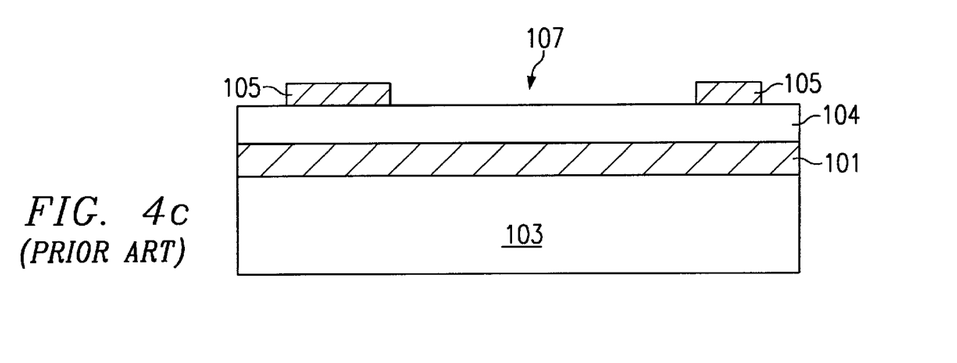

An oxide film 105 is formed onto the entire surface of such a silicon wafer structural layer 104((b) of the same FIG.), with an opening 107 being formed through patterning by etching a specific region ((c) of the same FIG.).

Figure 4D:
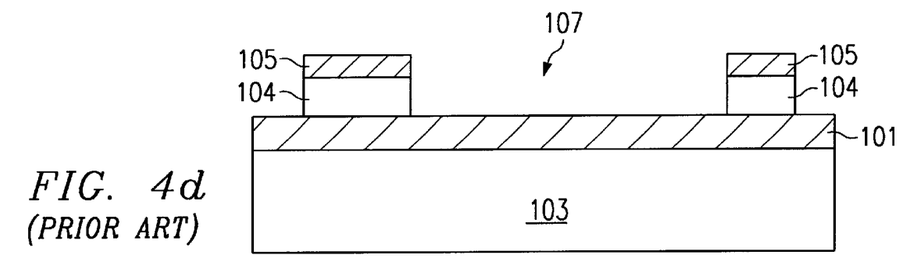

The surface of the silicon structural layer 104 is exposed in opening 107. The exposed structural layer 104, in is removed with anisotropic dry etching by an RIE method using the oxide film 105 as a mask; so that the structural layer is formed in the same pattern as that of the oxide film 105((d) of the same FIG.).

Figure 4E:
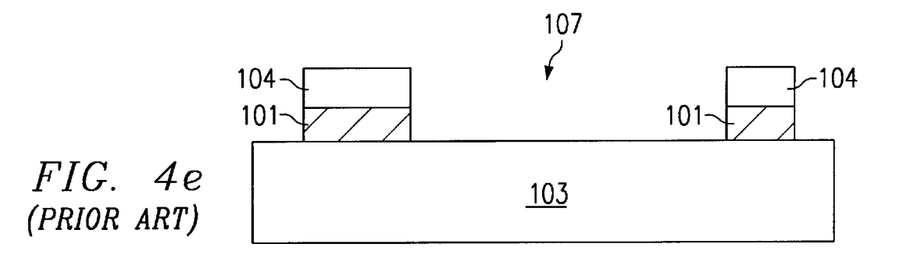

The sacrifice layer 101, which is exposed at the bottom the opening 107 at the completion of said patterning, and the oxide film 105, which was used for patterning the structural layer 104, are removed by performing wet etching ((e) of the same FIG.)

Figure 4F:
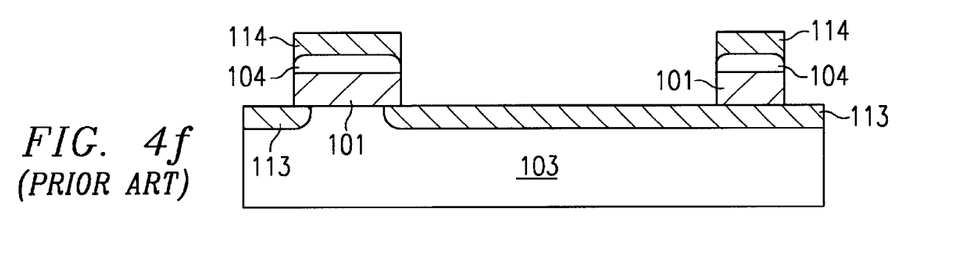

Subsequently, ion implantation and thermal diffusion are performed, with ohmic layers 113 and 114 being respectively formed in the substrate 103 and the structural layer 104 (FIG. 10(f)).

Figure 4G:
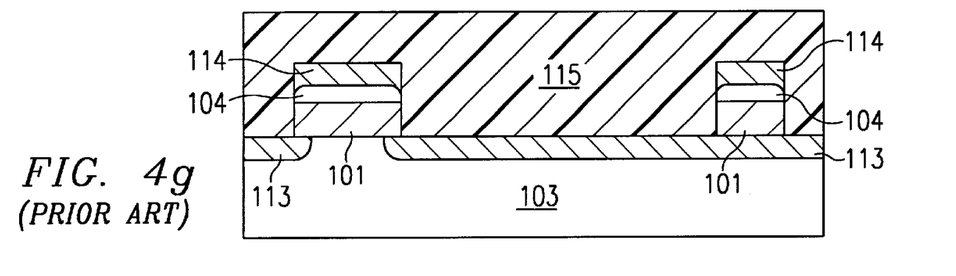
Figure 4H:
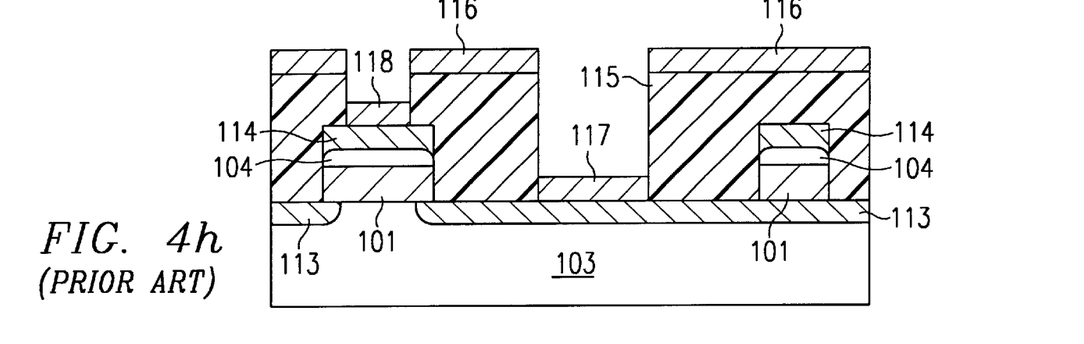

Next, a resist film 115 is formed onto the entire surface ((g)) of the same FIG.), windows are opened at specific sections above the ohmic layers 113 and 114, then the decomposition of chromium and platinum occurs, with thin chromium and platinum films 116, 117, and 118 being respectively formed over the resist film 115 and the ohmic layers 113 and 114((h) of the same FIG.).

Figure 4I:
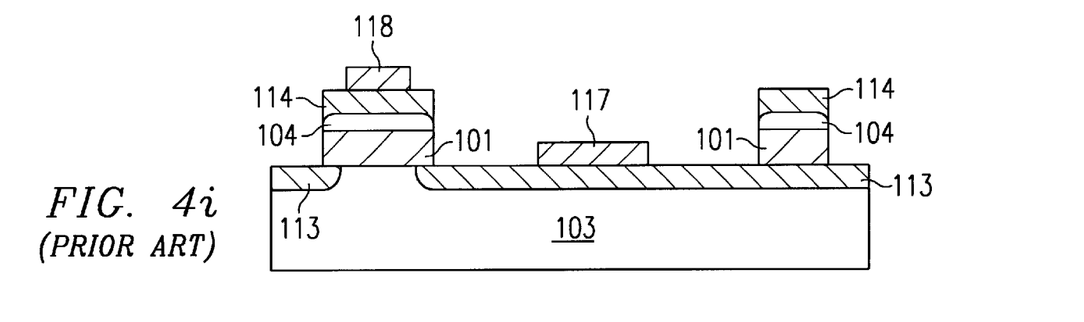

When the resist film 115 is removed, the thin chromium and platinum film 116 formed over the resist film 115 is removed together with the resist film 115 (lift-off method). On the other hand, the thin chromium and platinum films 117 and 118 formed over the ohmic layers 113 and 114 are not removed but remain with metallic electrodes being respectively formed at the substrate 103 and the fixed part 1204((i) of the same FIG.).

Figure 4J:
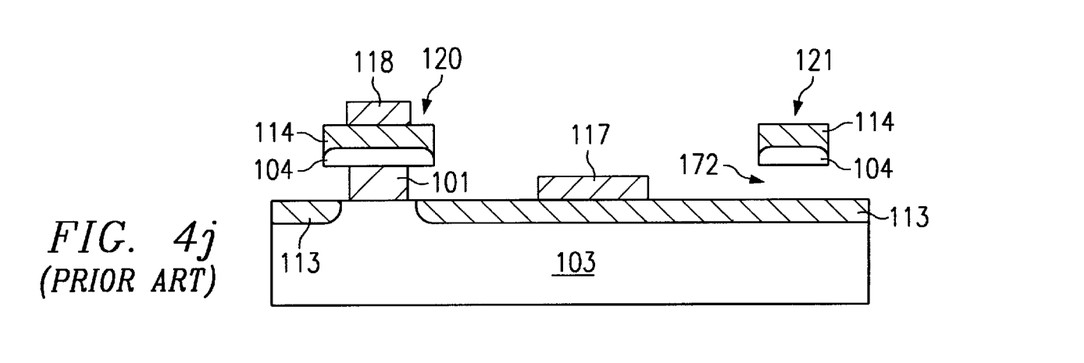

Furthermore, the entire [wafer] is soaked in a hydrofluoric buffer (BHF), the side faces of the sacrifice layer 101 are exposed, and the sacrifice layer 101 is etched from its side faces. During this procedure, in a region where the size of the structural layer area is large or where the width is wide, a portion of the sacrificial layer 101 remains. Accordingly, the structural layer 104 in that part is fixed to the substrate 103 by the sacrificial layer 101, forming fixed parts $120_1$ to $120_4$.

On the other hand, the sacrificial layer 101 underneath the of the structural layer 104 in a part where the area is small, or where the width is narrow, is completely removed. Accordingly, a space 72 is formed in the middle of the substrate 103 when the structural layer at that part is connected to the structural layer 54 which makes up the fixed part; a movable part, which does not make contact with the substrate 103, is thus constructed. The arms $121_1$ to $121_4$ and the box area 122 are constructed from such movable parts.

In this manner, the box area 122 and the arms $121_1$ to $121_4$ are supported by the fixed parts $120_1$ to $120_4$ in a condition in which they do not make contact with the substrate 103, the arms $121_1$ to $121_4$ are bent by the weight of the box area 122 when an acceleration is added, and the distance between the substrate 103 and the box area 122 changes.

Accordingly, thin metallic wires are connected to the electrodes 117 and 118 by wire-bonding, the box area 122 and the substrate 103 are connected to an external measuring circuit, not shown in the FIG., and it becomes possible to detect the change in the capacity between the box area 122 and the substrate 103 and to calculate the size of the acceleration.

However, as described above, a lift-off method is used for the formation of the thin chromium and platinum film 116 in the existing technology, and the processes are complicated. Moreover, the electrodes 117 and 118 could not be formed from a thin aluminum film, which forms a thin film wiring within an integrated circuit, when said lift-off method was used, which was becoming an obstacle when forming circuit elements and a micromachine on top of the same substrate.

The aim of this invention, which was created to solve the aforementioned inconveniences in the prior art, is to offer a technique that allows for the formation of electrodes in a composite device without using a lift-off method.

SUMMARY OF THE INVENTION

In solving the aforementioned problems, an embodiment in the invention is a manufacturing method for a composite device, consisting of: a process in which a mask film that has been patterned is formed over a structural layer which is formed over a substrate through a sacrificial layer; a process in which the aforementioned sacrificial layer is exposed through etching the aforementioned structural layer using said mask film as a mask; and a process in which the sacrificial layer is removed through the aforementioned exposed part by side etching, and in which movable parts are formed in parts of the aforementioned structural layer where the sacrificial layer underneath the bottom face is completely removed and fixed parts are formed in parts where the sacrificial layer underneath the bottom face remains. The invention is also characterized by consisting of: a process in which electrical elements are formed within the structural layer, which constructs the aforementioned fixed parts, before the formation of the aforementioned mask film; a process in which a thin metallic film, which at least includes electrodes for an external connection, is formed over the aforementioned structural layer; and a process in which said thin metallic film is patterned.

In another embodiment, a protective film is formed on the surface of the aforementioned electrode after forming the aforementioned thin metallic film and before forming the aforementioned mask film so that the aforementioned electrode cannot be etched when etching the aforementioned sacrificial layer.

In another embodiment, a passivation film that has been patterned can be formed over the aforementioned protective film after forming the aforementioned protective film and before forming the aforementioned mask film.

In a further embodiment, the aforementioned protective film over the aforementioned electrode may be removed using the aforementioned passivation film that has been patterned as the mask.

In an embodiment, the metallic wiring that connects the aforementioned electrical elements to each other may be formed by the thin metallic film upon patterning the aforementioned thin metallic film.

In another embodiment, the aforementioned substrate is secured over the conductive substrate, and an electrical connection with the aforementioned conductive substrate may be obtained from the back face of the aforementioned substrate.

In an embodiment the aforementioned passivation film is made of a silicon nitride film.

In an embodiment, the mask film is formed over the structural layer which is formed over the substrate through the sacrificial layer, the structural layer is etched and the sacrificial layer is exposed while using that mask film as the mask, the sacrificial layer underneath the bottom face of the structural layer is removed through side etching through that exposed part, movable parts are formed in the structural layer in areas where the sacrificial layer underneath the bottom face is completely removed, and the with fixed parts being formed in areas where the sacrificial layer underneath the bottom face remains. Therefore, a micromachine can be constructed with movable parts and fixed parts. However, electrical elements are forms within the structural layer which forms the fixed parts. Before forming the mask film described above, a thin metallic film that at least includes the electrodes for an external connection is formed over the structural layer and a circuit can be constructed by patterning that thin metallic film. Therefore, a micromachine and a circuit can be formed within the same substrate without using a lift-off method.

In this way, the protective film is formed on the surface of the electrode after forming the thin metallic film and before forming the mask film so that the electrode cannot be etched when etching the sacrificial layer and the surface of the electrode for an external electrical connection cannot be roughened, forming an electrode of good quality.

Also, a passivation film that has been patterned is formed over the protective film after forming said protective film and before forming the mask film, improving the reliability of the composite device. As such a passivation film, one that cannot be etched when removing the sacrificial film is ideal; in that case, it is possible to remove the protective film using the passivation film that has been patterned as the mask.

Furthermore, if metallic wiring that connects the electrical elements to each other is formed from the thin metallic film when patterning said thin metallic film, a composite device can be manufactured in ordinary manufacturing processes for an integrated circuit besides patterning the structural layer and removing the sacrifice layer.

Also, if an electrical connection with the conductive substrate is obtained from the back surface of the substrate when securing the substrate to said conductive substrate, such as a lead frame, an electrical connection of a capacitor which is constructed from movable parts and the substrate can be obtained without the formation of electrodes on the surface of the substrate.

An easy as well as low-cost manufacturing process is attained if the structural layer and the substrate described above are constructed of silicon substrates, and if the sacrificial layer is constructed of a silicon oxide film. Also, an easy process can be obtained if the passivation mask is formed of a silicon nitride film.

REFERENCE NUMERALS AND SYMBOLS AS SHOWN IN THE DRAWINGS

In the figures 2 represents a composite device, 3 a circuit part, 4 a micromachine part, 10 a fixed part, 11 a movable part, 37 a electrode, 38 a thin film wiring, 41 a electrical element, 50 a wafer, 51 a sacrifice layer, 53 a substrate, 54 a structural layer, 60 a thin metallic film, 64 a protective film, 65 a passivation film, 66 a mask film, and 80 a conductive substrate.

DESCRIPTION OF THE EMBODIMENTS

Figure 1:
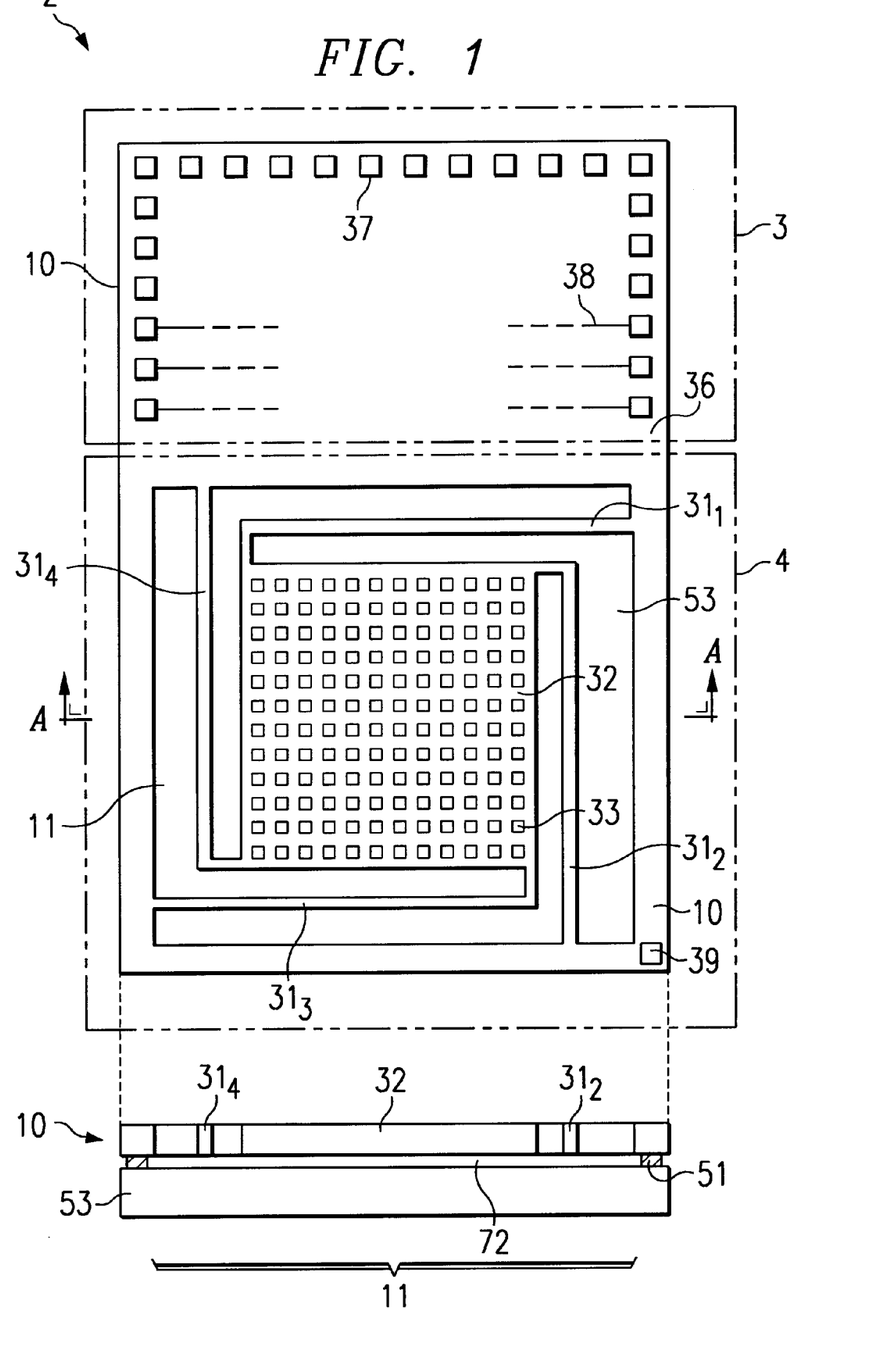
FIG. 1 is a diagram that illustrates one example of the composite device in this invention.

FIG. 1 illustrates a top view diagram of a composite device as one embodiment of this invention, as well as its cross-sectional view diagram at A—A.

This composite device 2 has a substrate 53, which is a silicon semiconductor, with a circuit part 3 and a micromachine part 4 being provided on top of said substrate 53.

The micromachine part 4 is an acceleration sensor, which has the same structure as the sensor 100 illustrated in FIG. 5; it has a movable part 11 that can move against the substrate 53 and a fixed part 10.

This acceleration sensor has arms $31_1$ to $31_4$ in a narrow width and a large box area 32 in which small holes 33 are formed into a matrix. One end of the arms $31_1$ to $31_4$ is connected to the fixed part 10; these are connected to the box area 32 which consists of the movable part 11 at the other ends and it is structured so that the box area 32 is supported by each of the arms $31_1$ to $31_4$ and the fixed part 10.

A space 72 is formed below of the arms $31_1$ to $31_4$ and the bottom surface of the box area 32. Accordingly, the box area 32 and the substrate 53 are in a noncontact state and it is structured so that each of the arms $31_1$ to $31_4$ is bent by the weight of the box area 32 when an acceleration is added such that the box area 32 can move in the vertical direction.

Accordingly, the arms $31_1$ to $31_4$ and the box area 32 are constructed of the movable part 11; a parallel and flat condenser which consists of the box area 32 and the substrate 53 changes its capacitance value when the box area 32 moves vertically.

On the other hand, the circuit part 3 has many electrical elements formed within the structural layer which forms the fixed part 36 and these electrical elements form a measuring circuit.

Also, an electrode pad 37 which consists of many electrodes for an external connection and which are formed through the patterning of a thin metallic film—as well as thin film wiring 38 which performs electrical connections among the electrical elements and electrical connections among the electrical elements and the electrode pad 37—are provided within the circuit part 3. The box area 32 is connected to the measuring circuit described above through said thin film wiring and it is constructed so that said measuring circuit can detect the change in the capacitance of the capacitor which consists of the box area 32 and the substrate 53.

The structure of such a composite device 2 will be explained together with its manufacturing method while referring to FIGS. 2(a)–(m), 4(j)–(m). Only a portion of a major part of the respective circuit part 3' and the micromachine 4' illustrated in FIG. 1 are shown in its cross-sectional structure.

Figure 2A:
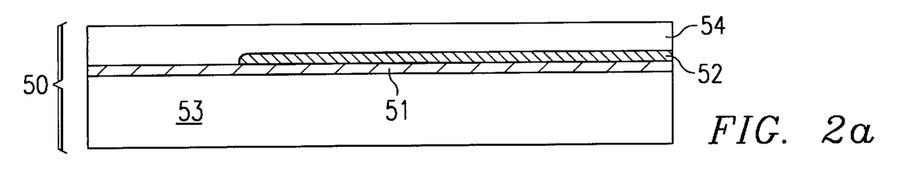
FIGS. 2(a)–(m) show diagrams that explain the manufacturing process.

First, two monocrystalline silicon wafers that have a silicon oxide film formed on the surface are prepared.

A diffusion layer 52 of the conductive type, which is opposite from the wafer, is formed within one monocrystalline silicon wafer in a specific region, and the silicon oxide film is formed on the surface at the side where said diffusion layer 52 is formed.

Silicon oxide films of the two monocrystalline silicon wafers are closely adhered, with one wafer 50 being formed by a direct bonding method.

The monocrystalline silicon layer in which the diffusion layer 52 is formed is afterwards polished and thinned to a specific thickness producing a structural layer 54 on the surface. The other layer in that condition forms the substrate 53. Also, the silicon oxide films which were used for direct bonding become a sacrificial layer 51.

Figure 2B:
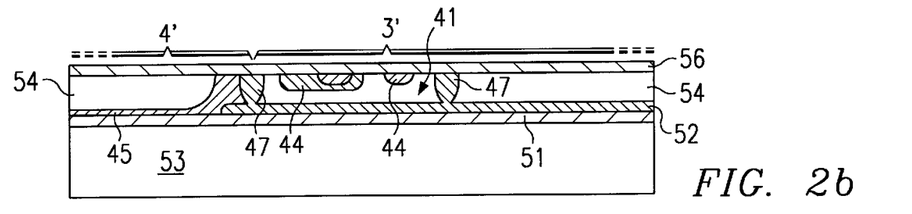

A general semiconductor process that is used in the manufacture of an integrated circuit is applied to this wafer 50, forming a group of electronic circuit elements including a bipolar-transistor. This is illustrated in the FIGS. A thin silicon thermal oxide film 56 is formed over the structural layer 54, multiple diffusion layers 44 are provided within the structural layer 54 (region indicated by the number 3'), which becomes the circuit part (with the diffusion layers 44 also including those that have a different conductivity type), and many electrical elements 41 are formed ((b) of the same FIG.).

In this way, a diffusion layer 45 of the same conductivity type as the structural layer 54 is diffused within the structural layer 54 (region indicated by the number 4'), which becomes the micromachine part, at about the same depth as the thickness of the structural layer 54. Also, separation layers 47 are provided within the structural layer 54 which becomes the circuit part and each of the electrical elements 41 is electrically separated together with the diffusion part 52.

Figure 2C:
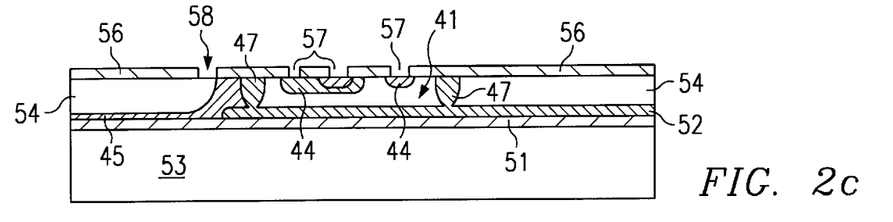

Next, an insulating film 56, which consists of a silicon oxide film, is formed on the surface of the structural layer 54, patterning is given to said insulating film 56, and openings 57 and 58 are respectively formed at specific positions over the electrical elements 41 and the structural layer 54, which becomes the micromachine part ((c) of the same FIG).

Figure 2D:
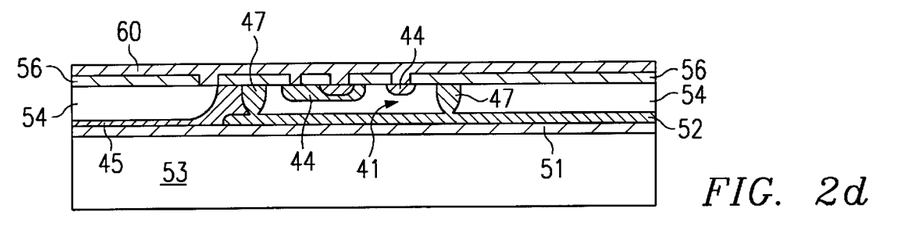
Figure 2E:
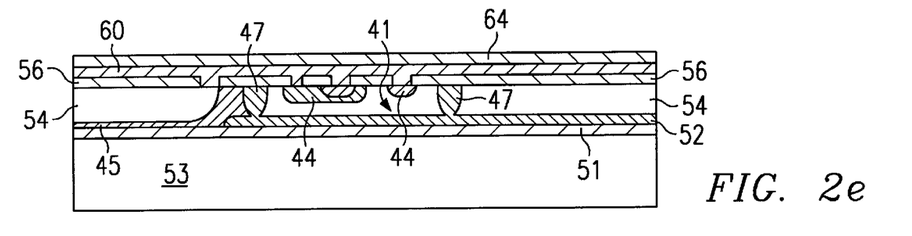

A thin aluminum metallic film 60 is then formed onto the entire surface by a sputtering method ((d) of the same FIG.) and a thin protective film 64 which is made of titanium tungsten is successively formed onto the entire surface of said thin metallic film 60 ((e) of the same FIG.).

Next, patterning is given to the protective film 64 and the thin metallic film 60 at the same time. An electrode pad 37 in a rectangular shape in a large area, along with a thin film wiring 38 in a narrow width, are formed. The protective film 64 and the thin metallic film 60 over the structural layer 54 which becomes the movable part 11 are thus removed.

Figure 2F:
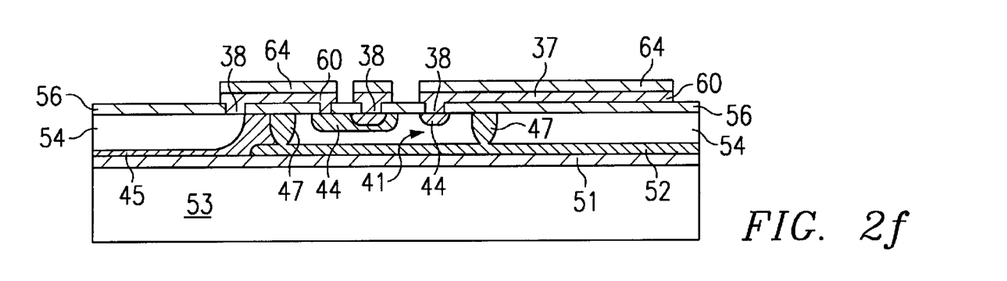

The thin film wiring 32 is electrically connected to the diffusion layer 45 and the diffusion layer 44 through the openings 57 and 58, among the electrical elements 41 and between the electrical elements 41 and the electrode pad 32, are electrically connected by the thin film wiring 38. Also, the movable part 11 in the micromachine part can be electrically connected to the electrical elements 41 and the electrode pad 37 by said thin film wiring 38 ((f) in FIG. 3).

Figure 2G:
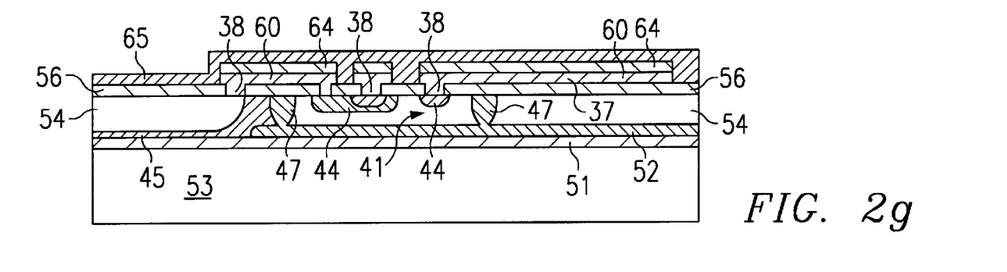
Figure 2H:
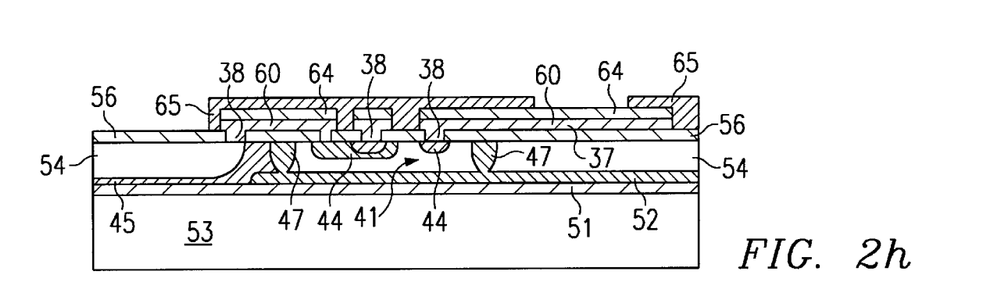

Next, a passivation film 65, which is made of a silicon nitride film, is accumulated on the surface ((g) of the same FIG.), the passivation film 65 over the micro-machine part and the electrode pad 37 is successively removed, the insulating film 56 then becomes exposed over the micromachine part, and the protective film 64 is exposed over the electrode pad 37 ((h) of the same FIG.).

Figure 2I:
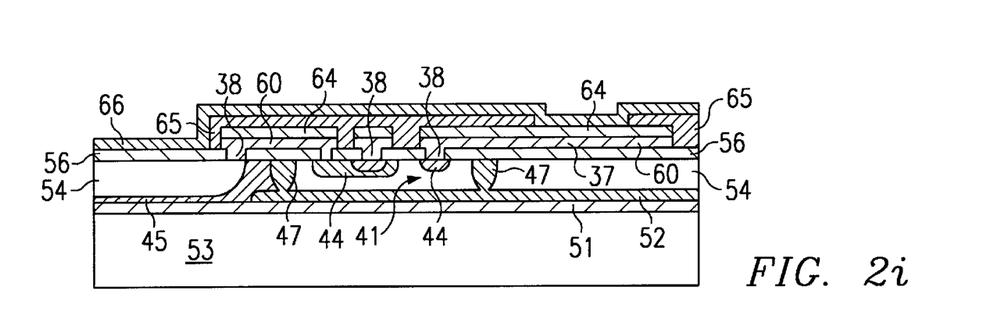

A mask film 66 which is made of a silicon oxide film is accumulated on that surface; this mask film 66 is formed over the insulating film 56, which is similarly made of the silicon oxide film, over the structural layer 54 within the micromachine part. Also, the mask film 66 is formed over the protective film 64, which is made of a thin layer of titanium tungsten, over the electrode pad 37 within the circuit part, while on the other hand, it is formed over the passivation film 65, which is made of a silicon nitride film, in other parts within the circuit part ((i) of the same FIG.).

Figure 2J:
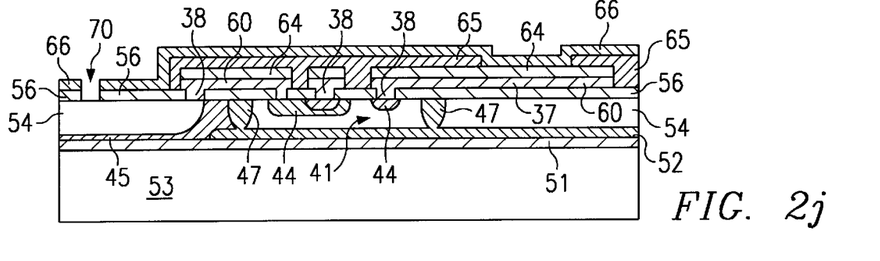

Next, patterning of the mask film 66 and the insulating film 56 is simultaneously obtained, an opening 70 is formed within the micromachine part, and the surface of the silicon structural layer 54 (diffusion layer 45) is exposed at the bottom face of that opening 70 (j) of the same FIG.).

Figure 2K:
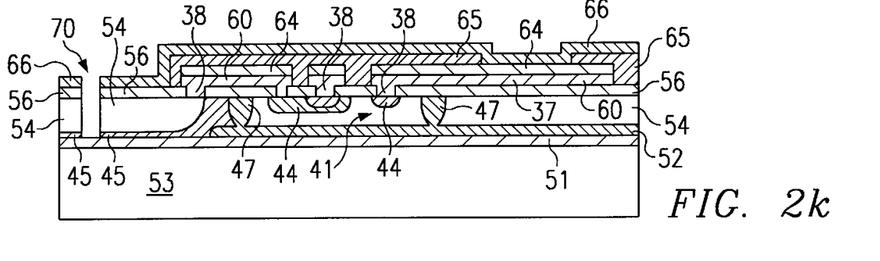

The mask film 66 is positioned on the surface of the regions except for the opening 70, and structural layer 54, which is exposed at the bottom face of the opening 70, is etched when anisotropic etching is performed using that mask film 66. This anisotropic etching stops when the surface of the sacrificial layer 51 is exposed at the bottom face of the opening 70((k) of the same FIG.). The structural layer 54, which constructs the arms $31_1$ to $31_4$ and the box area 32, is formed through such an etching of the structural layer 54 through the opening 70.

Successively, the entire [wafer] is soaked in a hydrofluoric buffer (BHF); etching of the sacrificial layer 51 starts from the bottom of the opening 70. This etching also advances into the horizontal direction of the sacrificial layer 51 (side etching), and the sacrificial layer 51 at the bottom face of the structural layer 54 is eroded from the side faces.

Figure 2L:
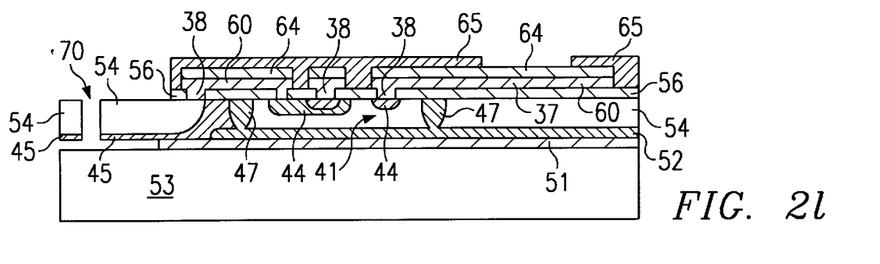

The sacrificial layer 51 is completely removed underneath the bottom face of the structural layer 54 in a part where the area is small or is formed in a narrow width; however, the sacrificial layer 51 remains underneath the bottom face of the structural layer 54 in a part where the area is large or is formed in a wide width, and the structural layer 54 of that part is secured to the substrate 53 by the sacrificial layer 51. The fixed part 10 is constructed of such a structural layer 54 in a large area or is formed in a wide width with the sacrificial layer at its bottom face.

The structural layer 34, in a small area or formed in a narrow width, is connected to [another] structural layer 54 that forms the fixed part 10, a space 72 is formed between the structural layer 54 and the substrate 53 in an area where the sacrificial layer 51 is removed, and a movable part 11 is formed by the structural layer 54 in that part ((1) of the same FIG.).

The width of the structural layer 54 of the arms $31_1$ to $31_4$ described above is narrow; these are connected to the structural layer 54 forming the fixed part 10 at one end. Therefore, the sacrificial layer 51 of the arms $31_1$ to $31_4$ is removed and they are joined by the movable part 11.

As described above, the arms $31_1$ to $31_4$ are connected to the four corners of the box area 32 at the other ends. Openings 70, which become small holes 33, are arranged into a matrix form in the structural layer 54 of the box area 32, the width of the structural layer 54 itself is formed narrow, the sacrificial layer 51 underneath is removed, and the box area 32 contains the movable part 11.

The mask film 66, which is made of the silicon oxide film just as the sacrificial layer 51, is also removed together when forming the fixed part 10 and the movable part 11 through etching of the sacrificial layer 51. In this manner, the passivation film 65 is thus exposed on the surface of the thin film wiring 38 in the circuit part, and the protective film 64 is exposed over the electrode pad 37. The insulating film 56 is exposed in the micromachine part when the mask film 66 is removed. However, because that insulating film 56 is made of the silicon oxide film, the insulating film 56 is also removed, and the surface of the structural layer 54 (diffusion layer 45) is exposed.

Figure 2M:
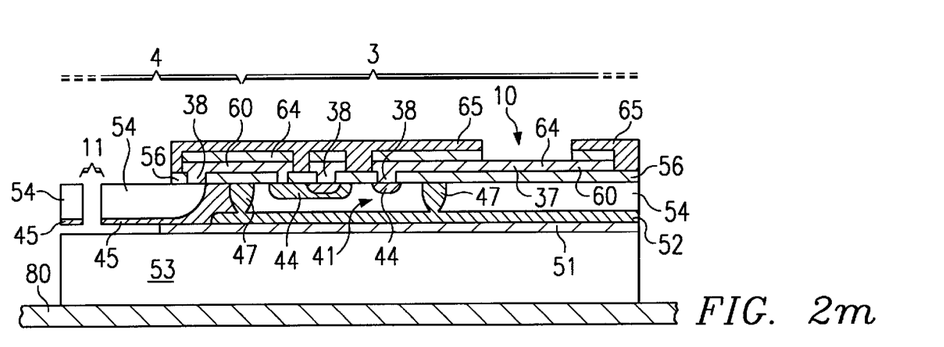

After etching the sacrificial layer 51, the entire [wafer] is soaked in aqueous hydrogen peroxide, then the protective film 64 which is exposed onto the surface of the electrode pad 37 is removed, and the thin metallic film 60 is exposed on the surface ((m) of the same FIG.).

Afterwards, the substrate 53 is secured over the conductive substrate 80, such as a lead frame, in a condition that has an electrical connection with the back surface of the substrate 53; the lead of the conductive substrate 80 and the electrode pad 37 are connected by wire bonding, and a composite device 2 can be obtained, in which a capacitor made of the substrate 53 and the box area 32 is connected to a measuring circuit within the circuit part 3 formed over the same substrate 53.

In this case, instead of having the wire bonding between the conductive substrate 80 and the electrode pad 37, the conductive substrate 80 may be [bonded] with a lead, for example, by wire bonding.

The thin film wiring 38 described above was formed within the circuit part 3, but it may be formed within the micromachine part 4 as illustrated by the number 39 in FIG. 1. The electrode 39 within said micromachine part 4 may be electrically connected with the diffusion layer 45 through the thin film wiring 38, it may be electrically connected with the box area 32 through a direct connection with the diffusion layer 45, or it may be connected to the measuring circuit within the circuitry part 3 by the thin film wiring 38 and may be used as its electrode.

The electrical elements 41 were separated by the pn junction in the above; however, this invention also includes those using various separation methods, such as a dielectric separation. Also, electrical elements 41 formed within the circuit part 3 broadly include electrical elements, such as bipolar transistors, MOS transistors, resistance elements, and capacitors.

Also, the composite device of an acceleration sensor, which detects the change in the capacitance of a capacitor, formed between the movable part and the substrate was explained above, but this invention should not be limited by that. For example, a composite device that measures the change in the capacity of a condenser, formed between a movable part and a fixed part, and other composite devices that have micromachines besides sensors; are also broadly included.

In the aforementioned embodiment, the structural layer 54 of the movable part 11 and the electrical elements 41 were connected through the thin film wiring 38, but they may be connected by the diffusion layer within the structural layer 54.

A thin titanium tungsten film was used as the protective film 64 described above, and a silicon oxide film was used as the mask film 66, but the substances are not limited to these. Any thin film that cannot be removed by the etching solution (hydrofluoric buffer solution in this example) when removing the sacrificial layer 51 may be used as the protective film 64, but a thin titanium tungsten film can be conveniently used as the protective film 64 because the aqueous hydrogen peroxide as its etching solution does not etch common passivation films, such as a silicon nitride film.

Materials that have a high selection ratio during etching of the silicon structural layer 54 can be used as the mask film 66. However, a silicon oxide film can be conveniently used because it can be removed together with the sacrificial layer 51.

Furthermore, the passivation film 67 described above was made of a silicon nitride film, but it is not limited to that. However, because the passivation film is exposed upon the removal of the sacrificial layer 51 when the mask film 66 is made of a silicon oxide film as described above, materials that cannot be etched by the hydrofluoric buffer are ideal.

An example of a SOI substrate was explained in the aforementioned embodiment, but structural layers that are manufactured using wafers made of polysilicon instead of monocrystalline silicon are also included in this invention.

Electrodes can be formed from a material that makes up the thin film wiring in this invention. Also, the micromachine may be manufactured without using a lift-off method.

Electrical elements, thin film wiring, and electrodes are formed before forming the mask film, so, a photolithographic process is not necessary after etching the structural layer.

What is claimed is:

1. A manufacturing method for a composite device, comprising the steps of:
   forming a structural layer over a substrate separated by a sacrificial layer wherein movable parts are formed by portions of the structural layer where the sacrifice layer underneath the bottom face is completely removed, and fixed parts being formed in portions of the structural layer where the sacrifice layer underneath the structural layer remains;
   forming electrical elements within the structural layer;
   forming a thin metallic film over at least portions of the structural layer;
   patterning a mask film over portions of the thin metallic film and removing portions of the thin metallic film that leaves remaining portions of the thin metallic film which at least includes an electrode for an external connection over the structural layer;
   patterning a second mask film over at least portions of the electrode and etching the structural layer to expose the sacrifice layer using the second mask film; and
   removing portions of the sacrifice layer at the bottom of the structural layer by side etching to form the moveable portions.

2. The manufacturing method for a composite device described in claim 1, wherein the electrical elements are formed within the moveable portion of the structural layer.

3. The manufacturing method for a composite device described in claim 1, further comprising the step of forming a passivation film prior to the second mask over the electrode.

4. The manufacturing method for a composite device described in claims 1, further comprising metallic wiring that connects the electrical elements to each other being formed by the thin metallic film at the patterning of the thin metallic film.

5. The manufacturing method for a composite device described in claim 1, further comprising an conductive substrate and wherein the substrate is secured over the conductive substrate, with an electrical connection with the conductive substrate being obtained from the back surface of the substrate.

6. The manufacturing method for a composite device described in claims 1, wherein the structural layer and the substrate are made of silicon substrates, and with the sacrificial layer is made of a silicon oxide film.

7. The manufacturing method for a composite device described in claims 3, wherein the passivation film is made of a silicon nitride film.

8. A manufacturing method for a composite device, comprising the steps of:
   forming a structural layer over a substrate separated by a sacrificial layer wherein movable parts are formed by portions of the structural layer where the sacrifice layer underneath the bottom face is completely removed, and fixed parts being formed in portions of the structural layer where the sacrifice layer underneath the structural layer remains;
   forming electrical elements within the structural layer;
   forming a thin metallic film over at least portions of the structural layer;
   forming a protective film over the thin metallic film and patterning the protective film over portions of the thin metallic film and removing portions of the thin metallic film that leaves remaining portions of the thin metallic film which at least includes an electrode for an external connection over the structural layer;
   forming a passivation film over at least portions of the electrode,
   patterning a second mask film over at least portions of the electrode covered by the passivation film and etching the structural layer to expose the sacrifice layer using the second mask film; and
   removing portions of the sacrifice layer at the bottom of the structural layer by side etching to form the moveable portions.

9. The manufacturing method for a composite device described in claim 8, wherein the electrical elements are formed within the fixed parts of the structural layer.

10. The manufacturing method for a composite device described in claims 8, further comprising metallic wiring that connects the electrical elements to each other being formed by the thin metallic film at the patterning of the thin metallic film.

11. The manufacturing method for a composite device described in claim 8, further comprising an conductive substrate and wherein the substrate is secured over the conductive substrate, with an electrical connection with the conductive substrate being obtained from the back surface of the substrate.

12. The manufacturing method for a composite device described in claims 8, wherein the structural layer and the substrate are made of silicon substrates, and with the sacrificial layer is made of a silicon oxide film.

13. The manufacturing method for a composite device described in claims 8, wherein the passivation film is used as a mask to etch the protective film.

* * * * *